United States Patent
Yan et al.

(10) Patent No.: US 6,914,258 B2
(45) Date of Patent: Jul. 5, 2005

(54) FIELD EFFECT TRANSISTOR IN SANDWICH CONFIGURATION HAVING ORGANIC SEMICONDUCTORS AND MANUFACTURING PROCESS THEREOF

(75) Inventors: Donghang Yan, Changchun (CN); Jun Wang, Changchun (CN); Jian Zhang, Changchun (CN)

(73) Assignee: Changchun Institute of Applied Chemistry Chinese Academy of Science, Changchun (CN)

( * ) Notice: Subject to any disclaimer, the term of this patent is extended or adjusted under 35 U.S.C. 154(b) by 0 days.

(21) Appl. No.: 10/645,642

(22) Filed: Aug. 21, 2003

(65) Prior Publication Data

US 2004/0155239 A1 Aug. 12, 2004

(30) Foreign Application Priority Data

Aug. 28, 2002 (CN) ........................................ 02129458 A (51) Int. Cl.$^7$ ........................... H01L 35/24; H01L 23/58
(52) U.S. Cl. ........................... 257/40; 257/40; 257/642; 257/759
(58) Field of Search ................................. 257/642, 759

(56) References Cited

U.S. PATENT DOCUMENTS 5,629,530 A    5/1997  Brown et al. .................. 257/40
6,528,816 B1 * 3/2003  Jackson et al. ................ 257/40
6,713,786 B2 * 3/2004  Colgan et al. ................. 257/59

* cited by examiner

*Primary Examiner*—Allan R. Wilson
*Assistant Examiner*—Joseph Nguyen
(74) *Attorney, Agent, or Firm*—Kinney & Lange, P.A.

(57) ABSTRACT

A field effect transistor in sandwiched configuration having organic semiconductor, comprising: a substrate (1), a gate electrode (2) formed on the surface of the substrate (1), a gate insulation layer (3) formed on the substrate (1) and the gate insulation layer (2), which is characterized in that, further comprising: an active layer (4) formed on the gate insulation layer (3) but leaving a part of the gate insulation layer (3) to be exposed, a source and drain electrodes (5) formed on a part of the gate insulation layer (3) and a part of the active layer (4), and an active layer (6) formed on the exposed part of the gate insulation layer (3), the active layer (4), the source electrode and the drain electrode (5). Taking full advantage of that the organic semiconductor can be processed under low temperature, the present invention adopts two or more kinds of materials to form the active semiconductor layer to make the active layer good contact with the source/drain electrode more effectively and reduce the threshold voltage of the device, and contact the semiconductor with the source/drain electrode and the insulation layer closely and tightly.

11 Claims, 6 Drawing Sheets

FIELD EFFECT TRANSISTOR IN SANDWICH CONFIGURATION HAVING ORGANIC SEMICONDUCTORS AND MANUFACTURING PROCESS THEREOF

FIELD OF THE TECHNOLOGY

The present invention relates to a Field Effect Transistor (to be abbreviated as FET hereinafter) and manufacturing process thereof, more particularly, to a FET having a sandwich structure in which a source electrode and a drain electrode are sandwiched between semiconductors and manufacturing process thereof.

BACKGROUND OF THE TECHNOLOGY

In recent years, the research on organic semiconductor is exceptionally active. The performance of the organic FET is superior to that of the amorphous silicon thin film transistor (a-Si:H TFT). In particular, the mobility of some organic micro-molecule oligomers (e.g. Pentacene, Tetracene, etc.) is over 1 (square centimeter per volt per second) at room temperature. So, the organic FET is potential in such practical applications as flexural integrated circuit (to be abbreviated as IC hereinafter), active matrix display and so on.

Figure 1A:
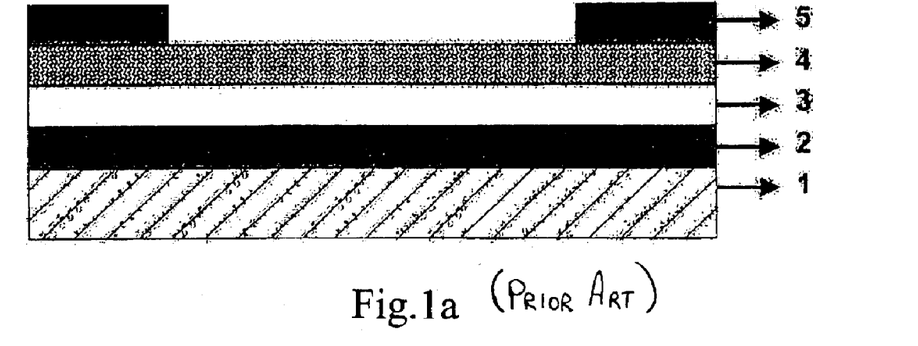
FIG. 1a shows an example of the conventional FET having a top electrode geometrical configuration.
Figure 1B:
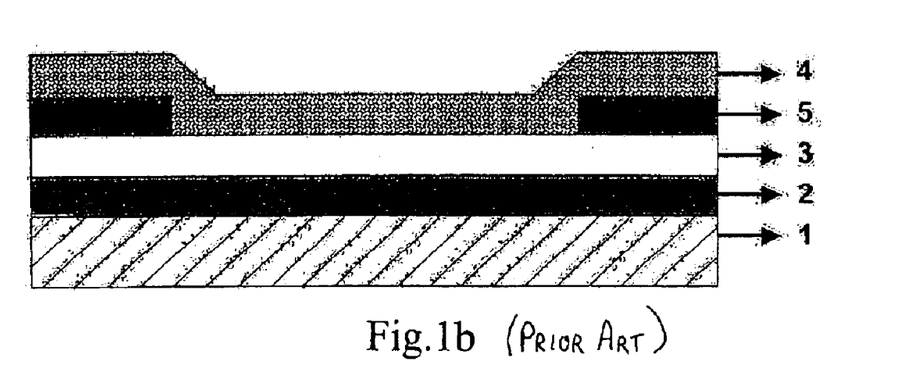
FIG. 1b shows an example of the conventional FET having a bottom electrode geometrical configuration.
Figure 1C:
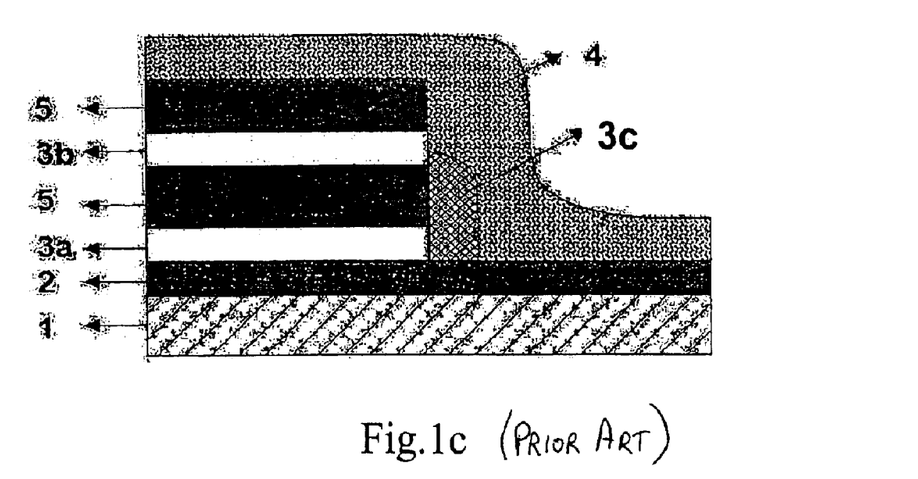
FIG. 1c shows an example of the conventional FET having a vertical geometrical configuration.

The organic FET generally adopts the bottom electrode configuration or the top electrode configuration. WO99/40631 disclosed a device with a vertical geometrical configuration. FIG. 1 shows the existing three geometrical configurations which were applied to obtain the organic FET, wherein, 1 represents the substrate, 2 represents the gate electrode, 3 represents the insulation layer, 4 represents the active layer and 5 represents the source and drain electrodes.

The devices having a bottom electrode configuration and a vertical configurations, respectively, have the advantage of easy to be integrated and processed. But it is difficult to make the later produced organic semiconductor contact with the source and drain electrodes effectively, so that the performance of the devices having two above configurations is inferior to that of the device having a top electrode configuration. Because the organic semiconductor materials are sensitive to some chemical solvents generally used in the processing of the inorganic semiconductor devices, there is difficulty in processing the device having a top electrode configuration by the conventional process for processing inorganic semiconductor devices.

The active layer of the existing organic FET is made of the material with the same molecule. U.S. Pat. No. 5,629,530 disclosed an organic FET having an active layer made of the molecules of the electron donor and receptor together. Because this kind of the semiconductor applies the principle of intermingling P with N to conduct electricity, the performances of switching current ratio and mobility of the FET device with this semiconductor are very poor.

SUMMARY OF THE INVENTION

The objective of this invention is to provide a FET in which an active semiconductor layer contacts with the source and drain electrodes effectively. The FET shall can be easily integrated and processed.

Another objective of this invention is to provide a process for manufacturing the present FET.

To achieve these objectives, according to one aspect of the invention, there is provided a FET comprising
a substrate (1),
a gate electrode (2) formed on the substrate (1),
a gate insulation layer (3) formed on the substrate (1) and the gate electrode (2),
which is characterized in that, further comprising:
an active layer (4) formed on the gate insulation layer (3) but leaving a part of the gate insulation layer (3) to be exposed,
a source and drain electrodes (5) formed on a part of the gate insulation layer (3) and a part of the active layer (4),
an active layer (6) formed on the exposed part of the gate insulation layer (3), the active layer (4), the source electrode and the drain electrode (5).

According to another aspect of the present invention, there is provided a process for producing the present FET, comprising:

a. forming a layer of conducting material on a substrate and then forming a gate electrode by the method of photolithography;

b. forming an insulation layer on the substrate and the gate electrode;

c. Vaporously depositing a semiconductor layer on a part of the insulation layer while leaving the other part of the insulation layer exposed;

d. forming a layer of conducting material on the exposed insulation layer and the semiconductor layer, and forming a source electrode and a drain electrode by the photolithography method or delaminating method;

e. Vaporously depositing or spin-coating a semiconductor layer on the source electrode, the drain electrode, the exposed semiconductor layer and the exposed insulation layer.

Taking full advantage of that the organic semiconductor can be processed under low temperature, the present invention adopts two or more kinds of materials to form the active semiconductor layer, makes the active layer contact with the source/drain electrode more effectively, reduces the threshold voltage of the device, and contacts the semiconductor with the source/drain electrode and the insulation layer tightly.

BRIEF DESCRIPTION OF THE FIGURES

Herein, "Pc" represents "phthalocyanine" and "Nc" represents "Naphthocyanine".

DETAILED DESCRIPTION OF THE PREFERRED EMBODIMENTS

The present invention will be described with reference to the accompanying drawings.

Figure 2:
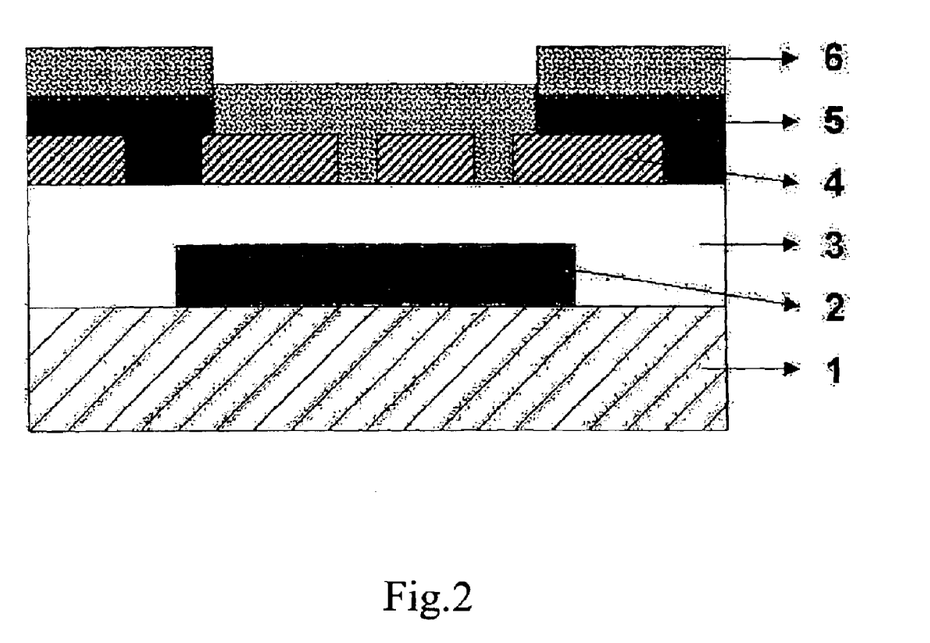
FIG. 2 illustrates the structure of the present sandwiched FET.
Figure 3:
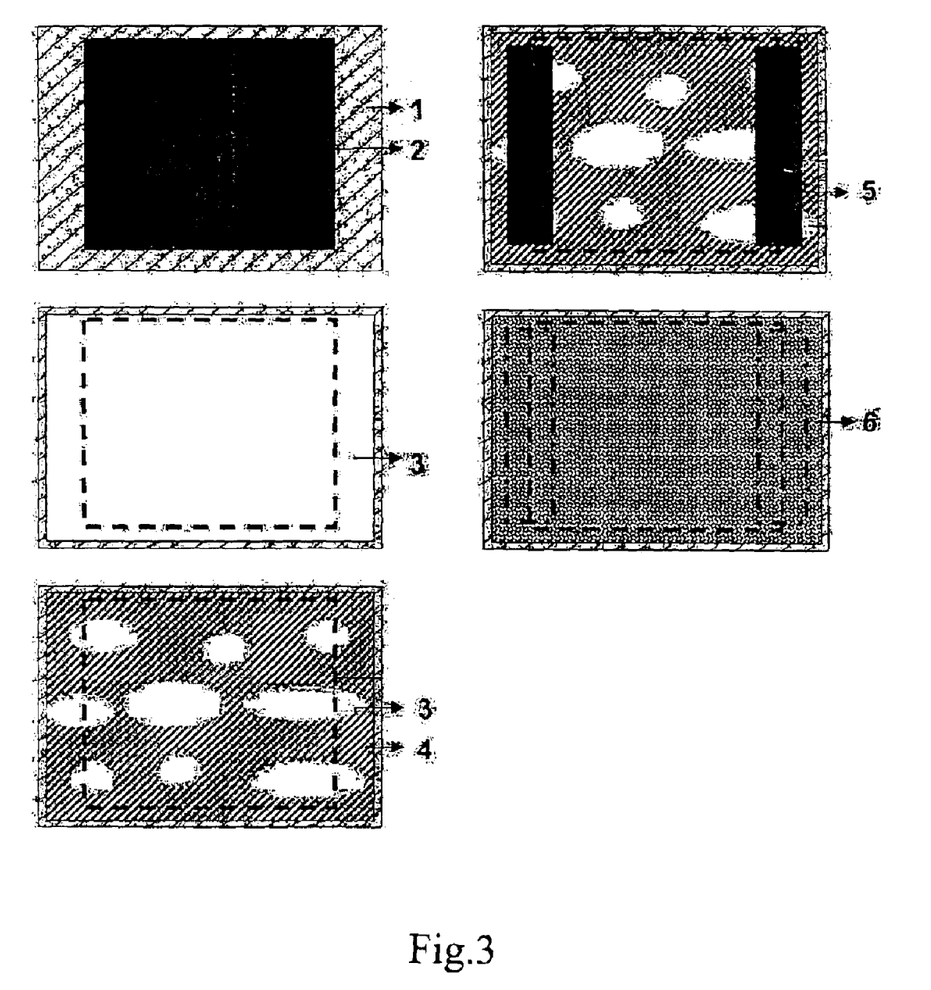
FIG. 3 illustrates the application procedure of the present sandwiched FET.

FIG. 2 illustrates the structure of the present sandwiched FET. The conducting material layer is set on the substrate (1) to form the gate electrode (2). The insulation material is set on the substrate and the gate electrode to form the gate insulation layer (3). The hole semiconductor is set on the gate insulation layer to form part of the active layer (4). The conducting material is set on the hole semiconductor layer and the gate insulation layer to form the source and drain electrode (5). In addition, together with the hole semiconductor, part of the semiconductor (6) is set on the gate insulation layer, the semiconductor layer, the gate of the source electrode and the drain electrode to form the active layer.

According to one example of the present invention, the eutectic and laminate structure of the existing model P type semiconductor CuPc and NiPc is adopted to form a kind of active semiconductor. Compared with a single kind of material, this active semiconductor's current on/off ratio has no obvious loss, while its threshold voltage has been reduced markedly and its carrier mobility has been greatly improved. The principle is that a semiconductor made of the mixture, eutectic and laminate of several kinds of material have good contact with the surfaces of the source and drain electrodes than the semiconductor made of a single kind of material does.

According to one example of the present invention, the laminate structure of the existing model P type semiconductor CuPc and the resistance material $NdPc_2$ is adopted to form a kind of active semiconductor. Compared with a single kind of material, this active semiconductor's switching current ratio and carrier mobility have been greatly improved, while its threshold voltage has been reduced markedly. The principle is that a semiconductor formed by laminating two kinds of material have good contact with the surfaces of the source and drain electrodes than CuPc does. Meanwhile, the field effect transmission property of CuPc is enhanced by $NdPc_2$.

Figure 6:
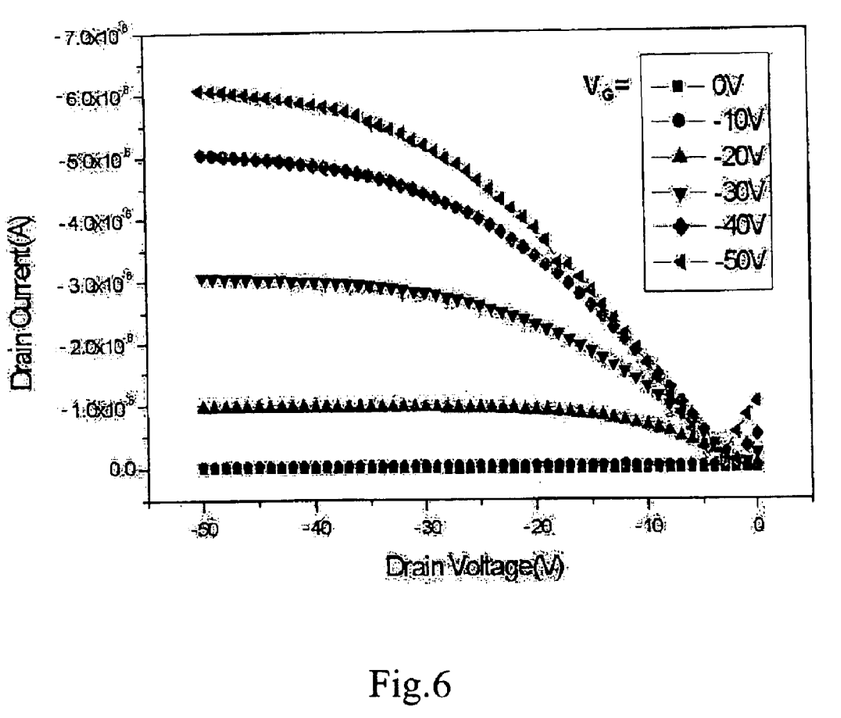
FIG. 6 shows the output characteristic curve of the present top electrode structural device whose active layer is composed of the eutectic organic semiconductor of CuPc and NiPc.

FIG. 6 also shows the output characteristic curve of the CuPc/NiPc eutectic FET. When $V_G$ equals to $-30V$, the FET's hole carrier mobility is 0.04 $cm^2/V.s$ in the saturation region, and its current on/off ratio is $4 \times 10^5$, and the threshold voltage is $-8V$.

The organic semiconductor of the present invention is made of the mixture, eutectic and laminate of various molecular materials. Compared with the device made of a single material, the properties of this FET, such as, the mobility, the threshold and the switching current ratio are improved markedly.

Now the present invention will be further illustrated with reference to the following examples.

EXAMPLE 1

Copper phthalocyanine (CuPc), zinc phthalocyanine (ZnPc), nickel phthalocyanine (NiPc), cobalt phthalocyanine (CoPc), $H_2Pc$, TiOPc, VOPc and Pentacene used in this example were commercial products, and they were sublimated and purified before being used.

On the 7059 glass substrate or the flexible plastic substrate 1, a film layer of metal Ta with about 200 nm in thickness was plated by using the radio frequency (RF) magnetism controlled sputtering method and shaped into the gate electrode 2 by the photolithography method. On the grid electrode, a film layer of $Ta_2O_5$ with a thickness of about 100 nm was reactively sputterred as the gate insulation layer 3 by the direct current (DC) magnetism controlled sputtering method. Then depositing CuPc using the molecular vapor phase deposition method to prepare the active layer 4 having a thickness of about 20 nm. Subsequently, using Au to prepare the source electrode and the drain electrode 5 with a thickness of about 50 nm. Finally, depositing one selected from a group consisting of CuPc, ZnPc, NiPc, CoPc, $H_2Pc$, TiOPc, VOPc or Pentacene using the molecular vapor phase deposition method to form the active layer 6 having a thickness of about 30 nm.

Figure 4:
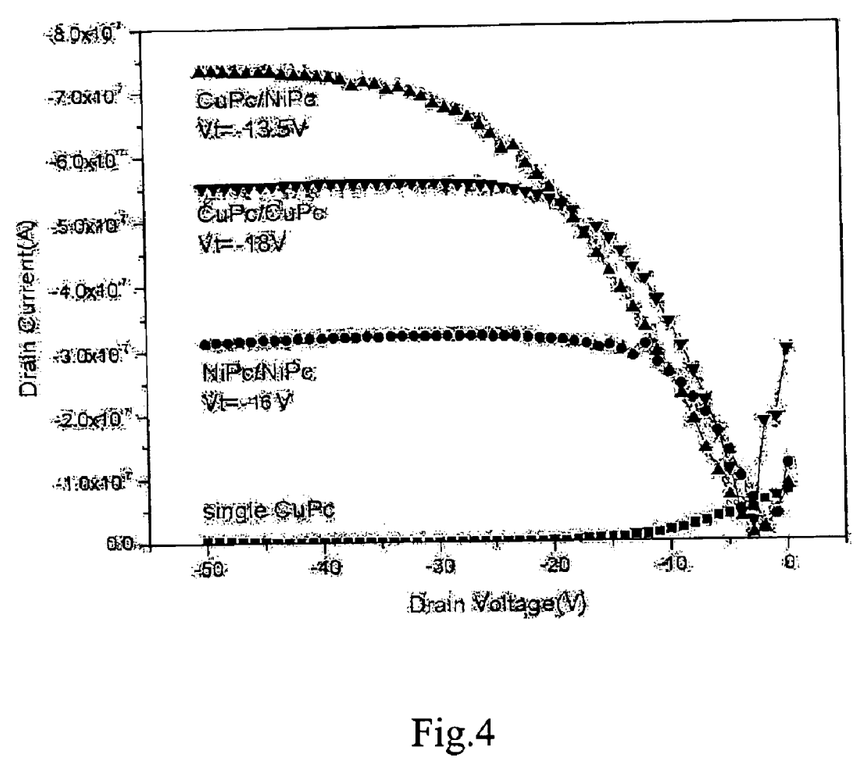
FIG. 4 shows the output characteristic curve of the present sandwiched FET in example 1, where the active layer adopts non-holonomic CuPc layer, the composite layer of CuPc and CuPc, the composite layer of NiPc and NiPc, the composite layer of CuPc and NiPc respectively.

FIG. 4 shows the output characteristic curve of the FET sandwiched with CuPc but having no active layer 6 when $V_G$ is $-30V$. From it, no obvious field effect was observed.

FIG. 4 shows the output characteristic curve of the CuPc/CuPc sandwich FET when $V_G$ is $-30V$. The FET's hole carrier mobility is 0.01 $cm^2/V.s$ in the saturation region, its threshold voltage is $-18V$, and its current on/off ratio is $4 \times 10^4$.

FIG. 4 also shows the output characteristic curve of the NiPc/NiPc sandwich FET when $V_G$ is $-30V$. The FET's hole carrier mobility is 0.005 $cm^2/V.s$ in the saturation region, its current on/off ratio is $4 \times 10^4$ and its threshold voltage is 16V when $V_G$ is $-30V$.

FIG. 4 also shows the output characteristic curve of the CuPc/NiPc sandwich FET when $V_G$ is $-30V$. The FET's hole carrier mobility is 0.01 $cm^2/V.s$ in the saturation region, its current on/off ratio is $4 \times 10^5$ and its threshold voltage is 13.5V when $V_G$ is $-30V$.

Compared with the CuPc/CuPc sandwich FET and the NiPc/NiPc sandwich FET, the CuPc/NiPc sandwich FET presents no obvious variation in the switching current ratio, but its threshold voltage is obviously reduced. Table 1 lists the performance parameters of the existing organic sandwich FET, in which, the mobility and threshold voltage are determined when $V_G$ equals to $-30V$.

TABLE 1

| Semiconductor 4 | Semiconductor 6 | Hole mobility $cm^2/V \cdot s$ | Threshold Voltage $-V$ |
|---|---|---|---|
| CuPc | CuPc | 0.01 | 18 |
| NiPc | NiPc | 0.005 | 16 |
| CuPc | NiPc | 0.01 | 13.5 |
| CuPc/NiPc (eutectic) | | 0.04 | 8 |
| CuPc | ZnPc | 0.006 | 5 |
| CuPc | CoPc | 0.003 | 11 |
| CuPc | $H_2Pc$ | 0.007 | 17 |
| CuPc | TiOPc | 0.009 | 17 |
| CuPc | VOPc | 0.01 | 15 |
| CuPc | Pentacene | 0.01 | 8 |

EXAMPLE 2

All the twin-Pc metals (e.g. $LaPc_2$, $CePc_2$, $PrPc_2$, $NdPc_2$, $SmPc_2$, $EuPc_2$, $GdPc_2$, $TbPc_2$, $DyPc_2$, $HoPc_2$, $ErPc_2$, $TmPc_2$, $YbPc_2$, $LuPc_2$, $YPc_2$, $ZrPc_2$, $HfPc_2$, $SnPc_2$), $H_2Nc$, CoNc, CuNc, ZnNc and NiNc used in the present example were synthesized by the methods discussed in the following references: (1) J. Jiang, R. C. W. Liu, T. C. W. Mack, T. D. W. Chan, D. K. P. Ng, Polyhedron, 1997, 16,515; (2) W. Liu, J. Jiang, D. Du, D. P. Arnold, Aust. J. Chem., 2000, 53, 131; (3) R. Polley, M. Hanack, J. Org. Chem., 1995, 60, 8278; (4) M. hanack, R. Polley, S. Knecht, U. Schlick, Inorg. Chem., 1995,34, 3621; (5) M. L. Kaplan, A. J. Lovinger, W. D. Reents, jun, P. H. Schmidt, Mol. Cryst. Liq. Cryst., 1984, 112, 345. They were sublimated and purified before being used.

On the 7059 glass substrate or the flexible plastic substrate 1, a film layer of metal Ta with about 200 nm in thickness was plated by using the radio frequency (RF) magnetism controlled sputtering method and shaped into the gate electrode 2 by the photolithography method. On the gate electrode, a film layer of $Ta_2O_5$ with a thickness of about 100 nm was reactively sputterred as the gate insulation layer 3 by the direct current (DC) magnetism controlled sputtering method. Then depositing CuPc using the molecular vapor phase deposition method to prepare the active layer 4 having a thickness of about 20 nm. Subsequently, using Au to prepare the source electrode and the drain electrode 5 with a thickness of about 50 nm by the photolithography technology. Finally, depositing one selected from a group consisting of twin-Pc metals ($LaPc_2$, $CePc_2$, $PrPc_2$, $NdPc_2$, $SmPc_2$, $EuPc_2$, $GdPc_2$, $TbPc_2$, $DyPc_2$, $HoPc_2$, $ErPc_2$, $TmPc_2$, $YbPc_2$, $LuPC_2$, $YPc_2$, $ZrPc_2$, $HfPc_2$, $SnPc_2$), $H_2Nc$, CoNc, CuNc, ZnNc and NiNc using the molecular vapor phase deposition method to form the active layer 6 having a thickness of about 30 nm.

Figure 5A:
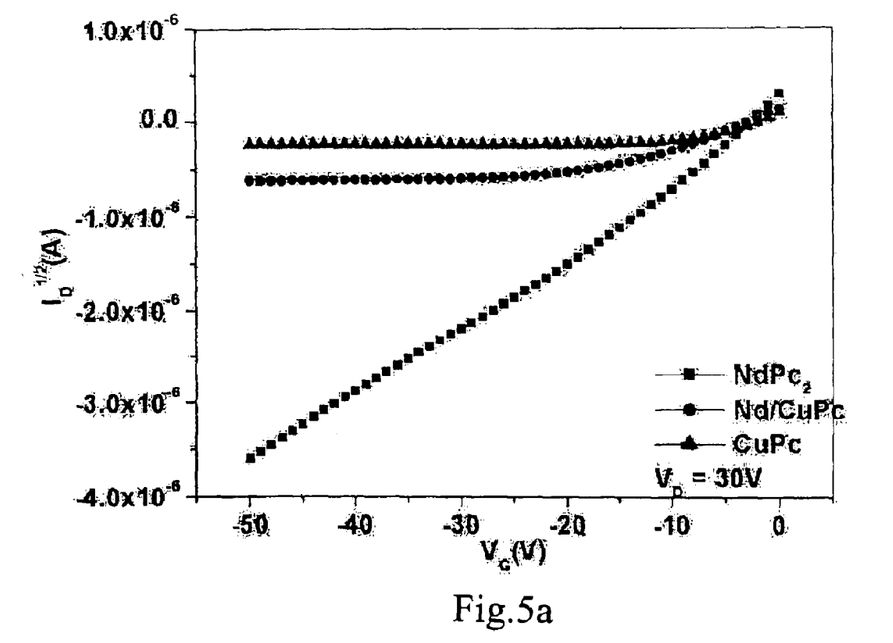
FIG. 5a shows the output characteristic curve of the present sandwiched FET in example 2, where the active layer adopts the composite layer of CuPc and CuPc, the composite layer of CuPc and NdPc, the single layer of NdPc respectively.
Figure 5B:
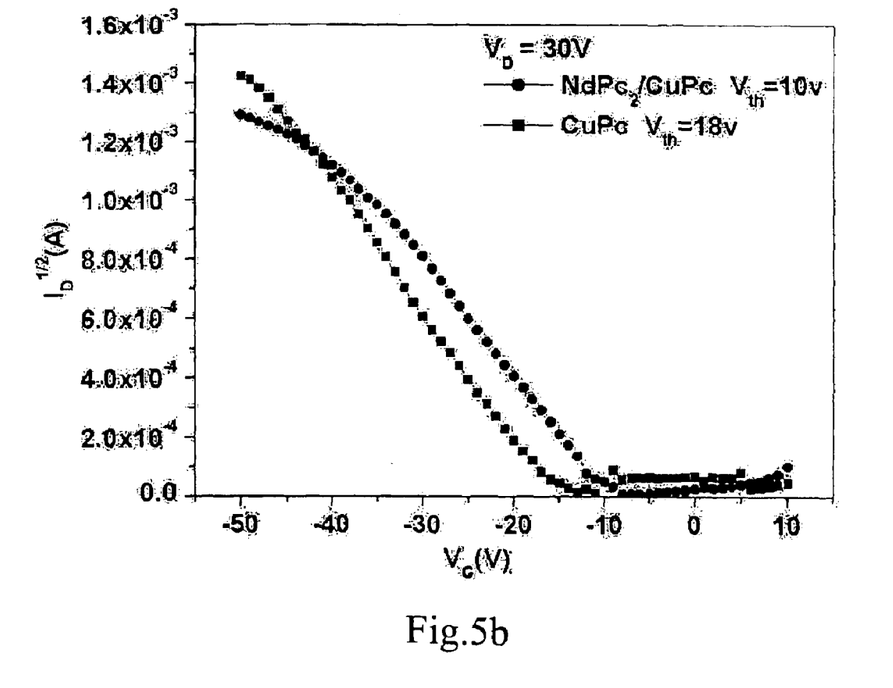
FIG. 5b shows the transfer characteristic curve of the present sandwiched FET in example 2, where the active layer adopts the composite layer of CuPc and CuPc, the composite layer of CuPc and NdPc respectively.

FIG. 5 shows the transfer characteristic curves of the NdNc top electrode FET and the NdNc sandwich FET. From it, we can see that the NdNc top electrode FET presents no field effect, while the NdNc sandwich FET presents steady field effect. When $V_G$ is −30V, the NdNc sandwich FET's hole mobility in the saturation region is 0.05 $cm^2$/V.s and the threshold voltage is −12V. Table 2 lists the performance parameters of the FET sandwiched new organic semiconductor, in which case, the mobility is under the constraint that $V_G$ equals to −30V.

TABLE 2

| Semiconductor 4 | Semiconductor 6 | Hole mobility $cm^2/V \cdot s$ |
| --- | --- | --- |
| CuPc | $LaPc_2$ | 0.02 |
| CuPc | $CePc_2$ | 0.017 |
| CuPc | $PrPc_2$ | 0.025 |
| CuPc | $NdPc_2$ | 0.015 |
| CuPc | $SmPc_2$ | 0.01 |
| CuPc | $EuPc_2$ | 0.03 |
| CuPc | $GdPc_2$ | 0.025 |
| CuPc | $TbPc_2$ | 0.009 |
| CuPc | $DyPc_2$ | 0.02 |
| CuPc | $HoPc_2$ | 0.01 |
| CuPc | $ErPc_2$ | 0.05 |
| CuPc | $TmPc_2$ | 0.03 |
| CuPc | $YbPc_2$ | 0.03 |
| CuPc | $LuPc_2$ | 0.07 |
| CuPc | $YPc_2$ | 0.05 |
| CuPc | $ZrPc_2$ | 0.06 |
| CuPc | $HfPc_2$ | 0.02 |
| CuPc | $SnPc_2$ | 0.007 |
| CuPc | $H_2Nc$ | 0.01 |
| CuPc | CoNc | 0.08 |
| CuPc | CuNc | 0.02 |
| CuPc | ZnNc | 0.05 |
| CuPc | NiNc | 0.02 |

EXAMPLE 3

$F_{16}CUPc$ and $F_{16}ZnPc$ used in the present experiment are commercial products, which have been sublimated and purified before being used.

On the 7059 glass substrate or the flexible plastic substrate 1, a film layer of metal Ta with about 200 nm in thickness was plated by using the radio frequency (RF) magnetism controlled sputtering method and shaped into the gate electrode 2 by the photolithography method. On the gate electrode, a film layer of $Ta_2O_5$ with a thickness of about 100 nm was reactively sputtered as the gate insulation layer 3 by the direct current (DC) magnetism controlled sputtering method. Then depositing $F_{16}CuPc$ using the molecular vapor phase deposition method to prepare the active layer 4 having a thickness of about 20 nm. Subsequently, using Au to prepare the source electrode and the drain electrode 5 with a thickness of about 50 nm by the photolithography technology. Finally, depositing $F_{16}ZnPc$ using the molecular vapor phase deposition method to form the active layer 6 having a thickness of about 30 nm. The electron mobility of the sandwich field effect devices is 0.02 $cm^2$/V.s in the saturation region. The electron mobility of the $F_{16}CuPc$ and $F_{16}ZnPc$ sandwich FET is 0.016 $cm^2$/V.s in the saturation region.

The present invention has been described by way of the above examples. The present invention is not limited to the modes described in the respective examples but naturally includes various other modes according to the principle of the present invention. In general, the sandwich FET according to the present invention can be processed to the elements of the 2D and 3D integrated devices. These integrated devices can be applied in flexible IC, the active matrix display and the like. The FET according to the present invention can be processed at low temperature. Besides the traditional photoetching, many methods such as mimeograph, printing and the like can be used to prepare the bipolar type FET of the present invention.

What is claimed is:

1. A field effect transistor sandwiched organic semiconductor, comprising:
   a substrate (1),
   a gate electrode (2) formed on the surface of the substrate (1),
   a gate insulation layer (3) formed on the substrate (1) and the gate electrode (2),
   which is characterized in that, further comprising:
   an organic active layer (4) formed on the gate insulation layer (3), or meanwhile leaving a part of the gate insulation layer (3) to be exposed,
   a source and drain electrodes (5) formed on a part of the gate insulation layer (3) and a part of the organic active layer (4),
   an active layer (6) formed on the exposed part of the gate insulation layer (3), the organic active layer (4), the source electrode and the drain electrode (5).

2. The field effect transistor according to claim 1, wherein the organic active layer (4) has holes.

3. The field effect transistor according to claim 2, wherein the semiconductor is an organic semiconductor material or a hybridized product of organic material and inorganic material.

4. The field effect transistor according to claim 3, wherein the organic semiconductor material is a solid-state material formed by mixing, eutecting or laminating of two or more kinds of molecular material.

5. The field effect transistor according to claim 4, wherein the organic semiconductor material has a carrier mobility of at least $10^{-3} cm^2$/V.s.

6. The field effect transistor according to claim 1, wherein a semiconductor material for the organic active layer (4) is the same as that for the active layer (6).

7. The field effect transistor according to claim 1, wherein a semiconductor material for the organic active layer (4) is different from that for the active layer (6).

8. The field effect transistor according to claim 1, wherein a semiconductor material for the active layers (4) and (6) is eutectic.

9. The field effect transistor according to claim 1, wherein the said active layers (4) and (6) are comprised of at least one selected from a group consisting of CuPc, NiPc, ZnPc, $H_2Pc$, TiOPc, VOPc, $F_{16}CuPc$, $F_{16}ZnPc$ and Pentacene, respectively.

10. The field effect transistor according to claim 1, wherein the organic active layer (4) is comprised of at least one selected from a group consisting of CuPc, NiPc, ZnPc, $H_2Pc$, $F_{16}CuPc$, $F_{16}ZnPc$ and Pentacene, and the said active layer (6) is comprised of at least one selected from a group consisting of twin-Pc metal, $H_2Nc$, CoNc, CuNc, ZnNc and NiNc.

11. The field effect transistor according to claim 10, wherein the twin-Pc metal is at least one selected from a group consisting of $LaPc_2$, $CePc_2$, $PrPc_2$, $NdPc_2$, $SmPc_2$, $EuPc_2$, $GdPc_2$, $TbPc_2$, $DyPc_2$, $HoPc_2$, $ErPc_2$, $TmPc_2$, $YbPc_2$, $LuPc_2$, $YPc_2$, $ZrPc_2$, $HfPc_2$ and $SnPc_2$.

* * * * *

UNITED STATES PATENT AND TRADEMARK OFFICE
CERTIFICATE OF CORRECTION

PATENT NO. : 6,914,258 B2 Page 1 of 1
APPLICATION NO. : 10/645642
DATED : July 5, 2005
INVENTOR(S) : Donghang Yan et al.

It is certified that error appears in the above-identified patent and that said Letters Patent is hereby corrected as shown below:

Column 4, Line 32, delete "16V", insert -- -16V --
Column 4, Line 38, delete "13.5V", insert -- -13.5V --
Column 7, Line 8, delete "the said active", insert --the active--

Signed and Sealed this

Second Day of January, 2007

JON W. DUDAS
*Director of the United States Patent and Trademark Office*